United States Patent [19]

Bjorklund et al.

[11] 4,194,134
[45] Mar. 18, 1980

[54] TWO-TERMINAL NETWORK COMPRISING A TRANSISTOR

[75] Inventors: Fritz L. G. Bjorklund, Tyreso; Carl-Olof Sandberg, Handen; Olaf Sternbeck, Bromma; Lars A. Wern, Stockholm, all of Sweden

[73] Assignee: Telefonaktiebolaget L M Ericsson, Stockholm, Sweden

[21] Appl. No.: 848,314

[22] Filed: Nov. 3, 1977

[30] Foreign Application Priority Data

Nov. 12, 1976 [SE] Sweden ............................ 7612698

[51] Int. Cl.² ........................ H03K 17/00; H03K 3/26
[52] U.S. Cl. ................................... 307/255; 307/310; 307/363; 361/91
[58] Field of Search ............... 307/310, 255, 200 A, 307/363; 330/207 P; 331/62; 363/50; 361/91

[56] References Cited

U.S. PATENT DOCUMENTS

| 3,551,699 | 12/1970 | Karwacki | 307/255 |
|---|---|---|---|
| 3,585,514 | 6/1971 | Kubicz | 330/207 P |
| 3,609,413 | 9/1971 | Lane | 361/91 |
| 3,651,379 | 3/1972 | Moisand et al. | 330/207 P |
| 3,876,914 | 4/1975 | Lukas | 361/91 |

OTHER PUBLICATIONS

IBM Tech. Discl. Bltn., "Overvoltage Protective Circuit," by P. Essinger, vol. 2, No. 4, Dec. 1959.

Primary Examiner—Stanley D. Miller, Jr.
Assistant Examiner—B. P. Davis
Attorney, Agent, or Firm—Hane, Roberts, Spiecens & Cohen

[57] ABSTRACT

A two-terminal network includes a transistor which is arranged to switch from a low-ohmic to a high-ohmic state when a predetermined value of a potential drop across a collector-emitter path of the transistor is exceeded; a regenerative threshold circuit arranged to disconnect a base current to the transistor the predetermined value of the potential drop is exceeded.

4 Claims, 1 Drawing Figure

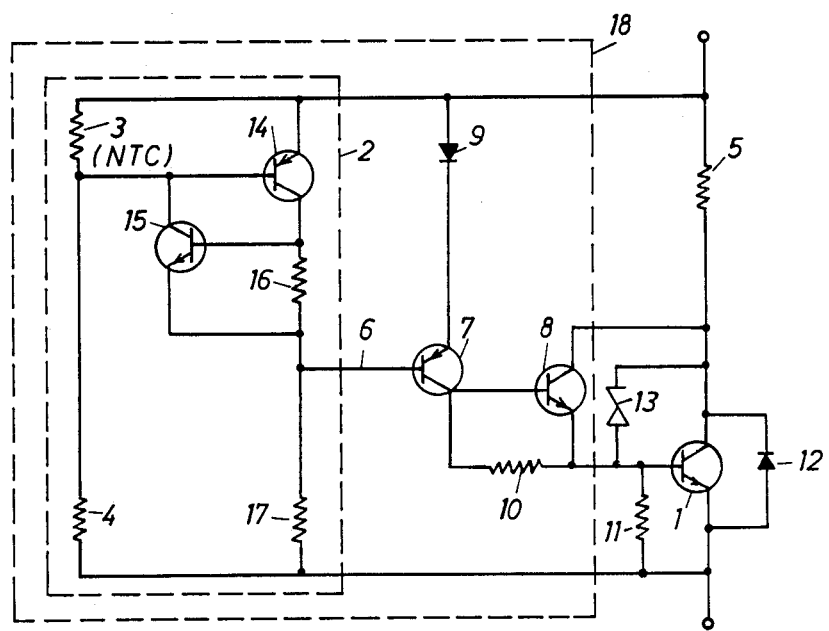

to switch quickly from a low-ohmic to a high-ohmic state.

TWO-TERMINAL NETWORK COMPRISING A TRANSISTOR

BACKGROUND OF THE INVENTION

The invention refers to a two-terminal network comprising a transistor which arranged to switch from a low-ohmic to a high-ohmic state when a predetermined value of a potential drop across a collector-emitter path of the transistor is exceeded.

Whenever a transistor is arranged to pass a large current and for an economical reason is not overdimensioned there is a risk of overheating the transistor in dependence on deviations from presumed values of the current, of the transistor, of the ambient temperature etc. Regardless of whether the transistor pass the current continuously or possibly in pulses the risk for overheating can be reduced by making a collector-emitter path of the transistor quickly switch from a low-ohmic to a high-ohmic state when a predetermined maximum value of a potential drop across the collector-emitter path is exceeded.

The two-terminal network according to the invention makes its mentioned transistor quickly switch from a low-ohmic to a high-ohmic state when a predetermined value of a potential drop across its collector-emitter path is exceeded. The two-terminal network can be connected in series with a load to form a switch for the latter. A possible application of the two-terminal network is to let its transistor become a part of a power stage in an amplifier to provide it with a built-in switch.

BRIEF DESCRIPTION OF THE DRAWING

The two-terminal network according to the invention, the characteristics of which appear from the following claims, will now be described more in detail with reference to the accompanying drawing which shows the preferred embodiment of the two-terminal network.

DESCRIPTION OF THE PREFERRED EMBODIMENT

The drawing shows a two-terminal network which comprises a transistor 1 which is arranged to switch from a low-ohmic to a high-ohmic state when a predetermined value of the potential drop across a collector-emitter path of the transistor 1 is exceeded. According to the invention the two-terminal network comprises a regenerative threshold circuit 2 arranged to disconnect the base current to the transistor 1 when the predetermined value of the potential drop is exceeded. The regenerative threshold circuit 2 has an input which comprises the shunt resistor 3 having a negative temperature coefficient adapted to maintain the operation of the two-terminal network unchanged within a predetermined temperature interval and a voltage dropping series resistor 4. Circuit 2 is connected across the collector-emitter path of the transistor 1 and the resistor 5 connected to this transistor.

The resistor 5 is not absolutely necessary but can be eliminated so that the input of the regenerative threshold circuit 2 being directly connected across the collector-emitter path of the transistor 1. Another alternative is to connect the input of the threshold circuit 2 directly across the resistor 5. Both of these alternatives, however, demand critical changes of the negative temperature coefficient of the resistor 3 and of the resistance of the resistor 4 if the two-terminal network is to switch within the predetermined temperature interval from a low-ohmic to a high-ohmic state at the same predetermined value of the above mentioned voltage drop as in the preferred embodiment.

The regenerative threshold circuit 2 has an output terminal 6 connected to the base electrode of the transistor 1 via a second and a third transistor 7 and 8. These transistors are connected in cascade with each other and are complementary. In order to make sure that the threshold circuit 2 can completely disconnect the base current to the transistor 1 a diode 9 is placed in the emitter circuit of the transistor 7 and two resistors 10 and 11 are connected in parallel with the base-emitter path of the transistor 8 and of the transistor 1, respectively. The latter transistor is protected against possible transients by providing its collector-emitter path and collector base path with a shunt diode 12 and a shunt zener diode 13 respectively.

In addition to the mentioned resistors 3 and 4, the regenerative threshold circuit 2 comprises two transistors 14 and 15 which according to the embodiment are of opposite conductivities and are arranged o form a flip-flop of a so-called hook-type, a resistor 16 being connected in parallel with the base-emitter path of the transistor 15 and a resistor 17 being connected in series with the collector-emitter paths of the transistors 14 and 15. Suitable component values for the realization of the shown embodiment is 50 kiloohms and a negative temperature coefficient (NTC) of the magnitude of 5700 ppm/° C. for the resistor 3, 150 kiloohms for the resistor 4, 0.6 ohms for the resistor 5, 500 ohms for the resistor 10, 50 ohms for the resistor 11, 5 kiloohms for the resistor 16 and 2.2 kiloohms for the resistor 17.

The regenerative threshold circuit 2, the two cascade-connected transistors 7 and 8, the diode 9 and the resistor 10 are in the preferred embodiment of the invention integrated in a monolitic circuit 18, one of the cascade-connected transistors being given a conventional vertical structure while the other suitably is given a lateral structure in order to save costs in the fabrication as it is described in the Swedish Pat. No. 337 851.

We claim:

1. A two-terminal network comprising: first and second terminals; a transistor means having base, emitter and collector electrodes for switching from a low-ohmic state to a high-ohmic state in accordance with the presence or absence of current through the base electrodes; means for connecting said emitter electrode to one of said terminals; means for connecting said collector electrode to the other of said terminals; a shunt diode connected across the emitter and collector electrodes of said transistor means; a zener diode connected across the collector and base electrodes of said transistor means; and a regenerative threshold switching device connected across said first and second terminals, said regenerative threshold switching device having an input means responsive to the potential across said terminals for switching said regenerative threshold switching device from a first state to a second state when the potential across said terminals exceeds a predetermined value, and said regenerative threshold switching device having an output means connected to the base electrode of said transistor means for cutting off the flow of current through said base electrode when said regenerative threshold switching device is in said second state.

2. A two-terminal network comprising: first and second terminals; a transistor means having base, emitter and collector electrodes for switching from a low-ohmic state to a high-ohmic state in accordance with the presence or absence of current through the base electrode; means for connecting said emitter electrode to one of said terminals; means for connecting said collector electrode to the other of said terminals; a regenerative threshold switching device connected across said first and second terminals, said regenerative threshold switching device having an input means responsive to the potential across said terminals for switching said regenerative threshold switching device from a first state to a second state when the potential across said terminals exceeds a predetermined value, and said regenerative threshold switching device having an output means; and connecting means connected to the output means of said regenerative threshold switching device, said connecting means comprising a pair of cascaded complementary transistor amplifiers, wherein one of said cascaded transistor amplifiers has a base electrode connected to the output means of said regenerative threshold switching device, an emitter electrode connected to one of said terminals and a collector electrode connected to the other of said transistor amplifiers, said other transistor amplifier being connected to the base electrode of said transistor means for cutting off the flow of current through said base electrode when said regenerative threshold switching device is in said second state.

3. The two-terminal network of claim 2 further comprising a diode means for connecting the emitter electrode of said one cascaded transistor amplifier to said one terminal.

4. The two-terminal network of claim 2, wherein the other of said cascaded transistor amplifiers has a collector electrode connected to the collector electrode of said transistor means, a base electrode connected to the collector electrode of said one cascaded transistor amplifier, and an emitter electrode connected to the base electrode of said transistor means, a first resistor connected between the base and emitter electrodes of said other cascaded transistor amplifier and a second resistor connected between the emitter electrode of said other cascaded transistor amplifier and said one of said terminals.

* * * * *